(12) United States Patent
Huang et al.

(10) Patent No.: US 11,748,549 B2
(45) Date of Patent: Sep. 5, 2023

(54) METHOD AND APPARATUS FOR INTEGRATED CIRCUIT MASK PATTERNING

(71) Applicant: Taiwan Semiconductor Manufacturing Company, Ltd., Hsin-Chu (TW)

(72) Inventors: Chin-Min Huang, Taichung (TW); Bo-Han Chen, Hsinchu (TW); Cherng-Shyan Tsay, Toufen Township (TW); Chien-Wen Lai, Hsinchu (TW); Hua-Tai Lin, Hsinchu (TW); Chia-Cheng Chang, Baoshan Township (TW); Lun-Wen Yeh, Ji-an Township (TW); Shun-Shing Yang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 309 days.

(21) Appl. No.: 17/236,832

(22) Filed: Apr. 21, 2021

(65) Prior Publication Data
US 2021/0240907 A1    Aug. 5, 2021

Related U.S. Application Data

(62) Division of application No. 15/868,113, filed on Jan. 11, 2018, now Pat. No. 10,990,744, which is a
(Continued)

(51) Int. Cl.
*G06F 30/398* (2020.01)
*G03F 1/36* (2012.01)
*G03F 1/70* (2012.01)

(52) U.S. Cl.
CPC .............. *G06F 30/398* (2020.01); *G03F 1/36* (2013.01); *G03F 1/70* (2013.01)

(58) Field of Classification Search
CPC ............. G06F 30/398; G03F 1/36; G03F 1/70
(Continued)

(56) References Cited

U.S. PATENT DOCUMENTS 5,821,014 A    10/1998   Chen et al.
6,312,854 B1   11/2001   Chen et al.
(Continued)

FOREIGN PATENT DOCUMENTS

JP    2002055434 A  *  2/2002   ............... G03F 1/36

*Primary Examiner* — Suresh Memula
(74) *Attorney, Agent, or Firm* — HAYNES & BOONE, LLP

(57) ABSTRACT

Various integrated circuit (IC) design methods are disclosed herein. An exemplary method includes receiving an IC design layout having an IC feature to be formed on a wafer using a lithography process and inserting a spacing in the IC feature, thereby generating a modified IC design layout that divides the IC feature into a first main feature and a second main feature separated by the spacing. The spacing has a sub-resolution dimension, such that the IC feature does not include the spacing when formed on the wafer by the lithography process using the modified IC design layout. A mask can be fabricated based on the modified IC design layout, wherein the mask includes the first main feature and the second main feature separated by the spacing. A lithography process can be performed using the mask to form the IC feature (without the spacing) on a wafer.

20 Claims, 6 Drawing Sheets

Related U.S. Application Data division of application No. 14/949,713, filed on Nov. 23, 2015, now Pat. No. 9,870,443, which is a division of application No. 13/956,962, filed on Aug. 1, 2013, now Pat. No. 9,195,134.

(58) Field of Classification Search
USPC .......................................................... 716/53
See application file for complete search history.

(56) References Cited

U.S. PATENT DOCUMENTS

| | | | |
|---|---|---|---|
| 6,370,679 B1 | 4/2002 | Chang et al. | |
| 7,487,489 B2 | 2/2009 | Granik | |
| 7,849,423 B1 | 12/2010 | Yenikaya et al. | |
| 8,103,985 B2* | 1/2012 | Sweis ..................... | G03F 1/36 716/54 |
| 8,627,244 B2 | 1/2014 | Agarwal et al. | |
| 8,972,909 B1 | 3/2015 | Chang et al. | |
| 2004/0209169 A1* | 10/2004 | Cui ....................... | G06F 30/398 430/5 |
| 2005/0202321 A1* | 9/2005 | Gordon ................... | G03F 1/36 430/311 |
| 2005/0202326 A1* | 9/2005 | Gordon ................... | G03F 1/36 716/54 |
| 2006/0046160 A1* | 3/2006 | Wallace ................... | G03F 1/36 430/311 |
| 2006/0240331 A1 | 10/2006 | O'Brien et al. | |
| 2006/0240336 A1 | 10/2006 | Watson et al. | |
| 2007/0035031 A1* | 2/2007 | Jessen ..................... | G03F 1/36 430/5 |
| 2007/0128525 A1* | 6/2007 | Wallace ................... | G03F 1/36 716/55 |
| 2007/0128526 A1* | 6/2007 | Wallace ................... | G03F 1/36 716/55 |
| 2007/0224519 A1 | 9/2007 | Sivakumar et al. | |
| 2008/0063948 A1 | 3/2008 | O'Brien | |
| 2008/0082952 A1 | 4/2008 | O'Brien | |
| 2008/0193859 A1 | 8/2008 | Hamouda | |
| 2008/0301620 A1 | 12/2008 | Ye et al. | |
| 2009/0119634 A1* | 5/2009 | Sweis ..................... | G03F 1/70 716/50 |
| 2009/0138835 A1 | 5/2009 | Sinha et al. | |
| 2009/0258302 A1 | 10/2009 | Ho et al. | |
| 2009/0300574 A1* | 12/2009 | Reed ....................... | G06F 30/39 716/50 |
| 2010/0023915 A1 | 1/2010 | Granik | |
| 2010/0138806 A1 | 6/2010 | Tang | |
| 2010/0153903 A1* | 6/2010 | Inoue ...................... | G03F 1/36 716/54 |
| 2010/0153905 A1* | 6/2010 | Maeda ..................... | G03F 1/00 716/54 |
| 2010/0262946 A1 | 10/2010 | Poonawala et al. | |
| 2011/0294239 A1* | 12/2011 | Kodama .................. | G03F 1/36 716/52 |
| 2012/0072874 A1 | 3/2012 | Chiang et al. | |
| 2012/0083124 A1 | 4/2012 | Huang et al. | |
| 2013/0249918 A1 | 9/2013 | Takekawa et al. | |
| 2014/0317581 A1 | 10/2014 | Chuang et al. | |

\* cited by examiner

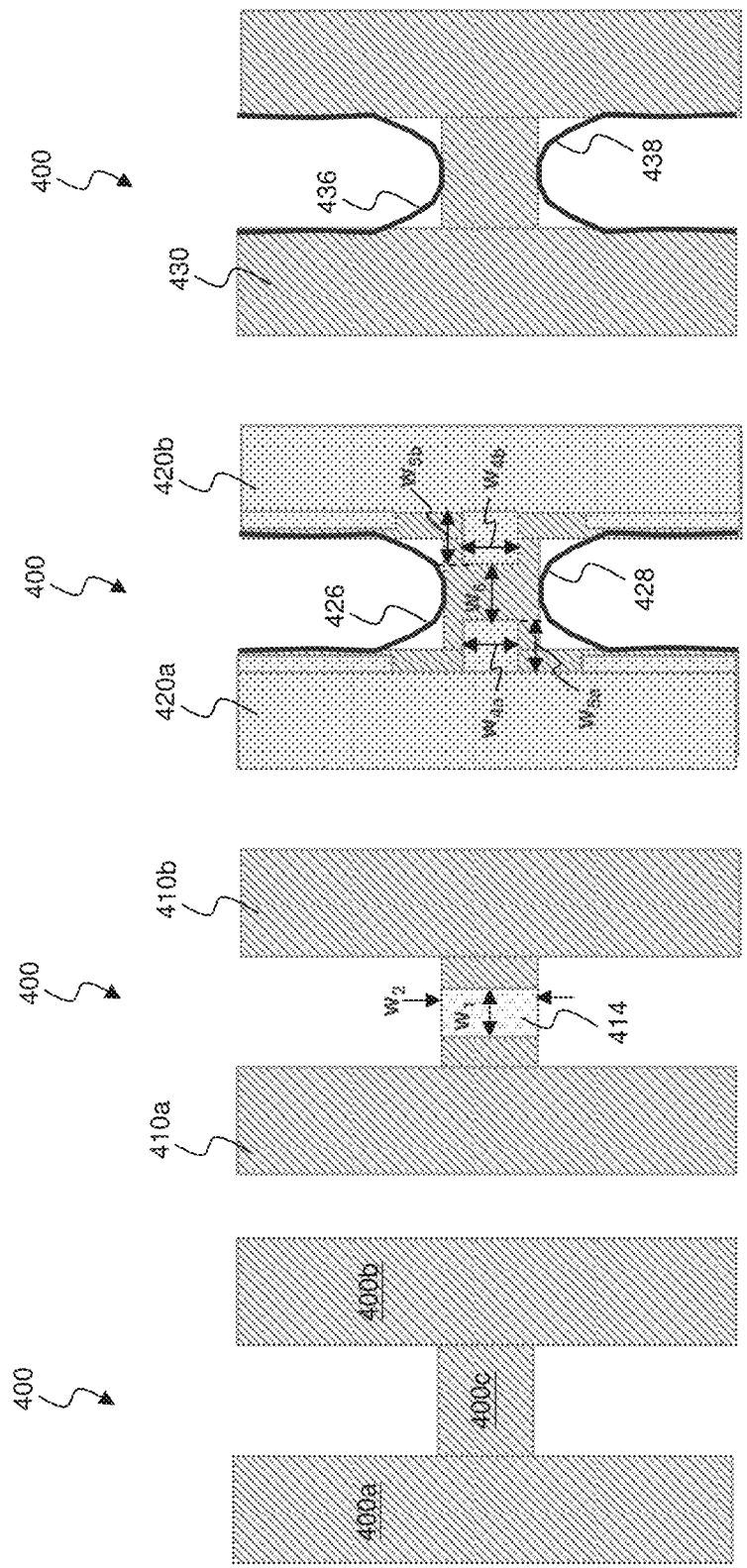

METHOD AND APPARATUS FOR INTEGRATED CIRCUIT MASK PATTERNING

CROSS-REFERENCE TO RELATED APPLICATIONS

This is a divisional application of U.S. patent application Ser. No. 15/868,113, filed Jan. 11, 2018, which is a divisional application of U.S. patent application Ser. No. 14/949,713, filed Nov. 23, 2015, now U.S. Pat. No. 9,870,443, which is a divisional application of U.S. patent application Ser. No. 13/956,962, filed Aug. 1, 2013, now U.S. Pat. No. 9,195,134, all of which are herein incorporated by reference in their entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as IC technologies are continually progressing to smaller technology nodes, such as a 65 nm technology node, a 45 nm technology node, and below, simply scaling down similar designs used at larger nodes often results in inaccurate or poorly shaped device features. Rounded corners on a device feature that is designed to have right-angle corners may become more pronounced or more critical in the smaller nodes, preventing the device from performing as desired. Other examples of inaccurate or poorly shaped device features include pinching, necking, bridging, dishing, erosion, metal line thickness variations, and other characteristics that affect device performance. Typically, optical proximity correction (OPC) may be performed on a design pattern to help alleviate some of these difficulties before the pattern is created on a mask. However, current OPC techniques may not offer enough fidelity to correct problems in sub-45 nm designs. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A-4D illustrate an IC feature mask creation according to various aspects of the present disclosure.

DETAILED DESCRIPTION

Figure 1:
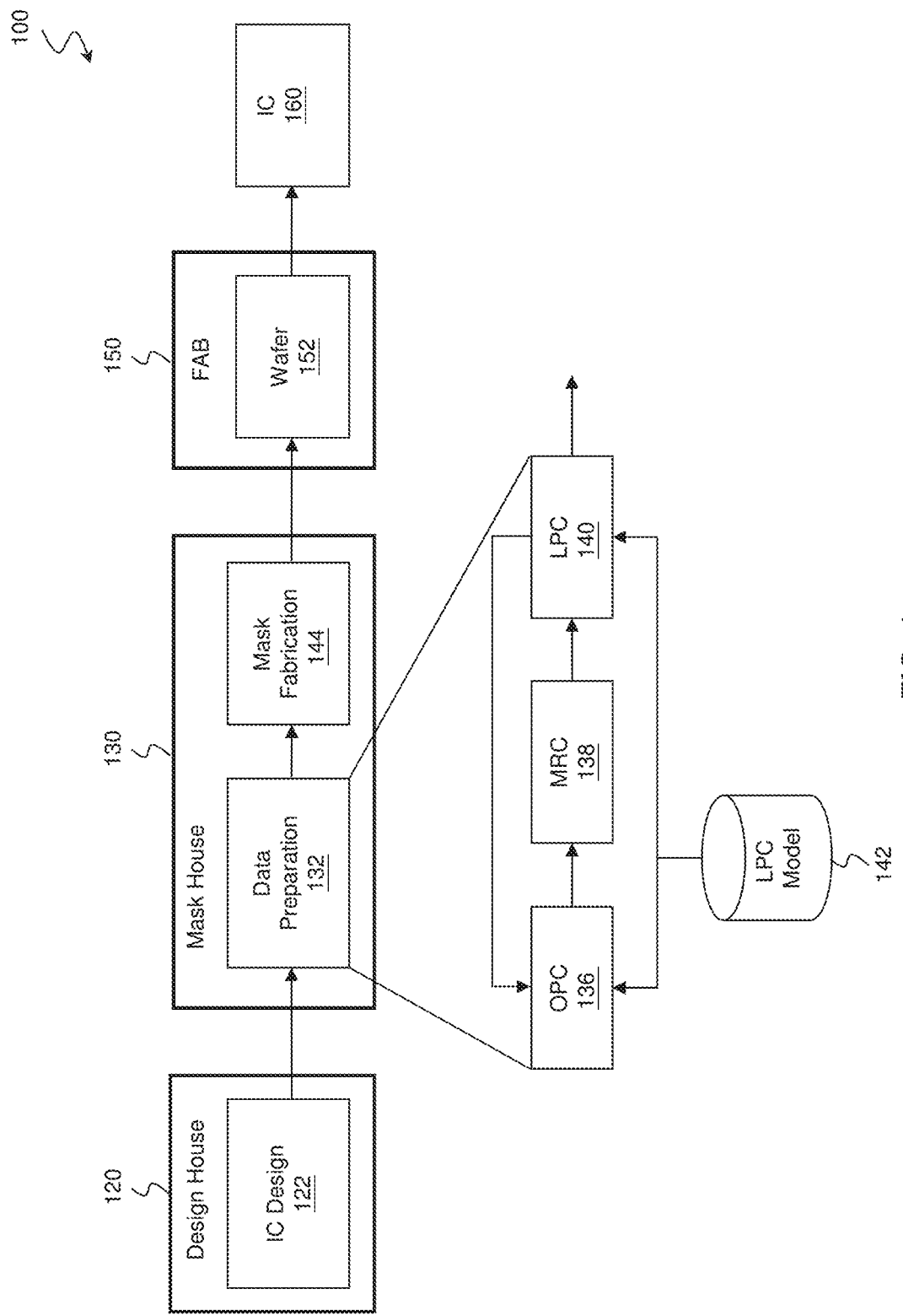
FIG. 1 is a simplified block diagram of an embodiment of an integrated circuit (IC) manufacturing system and an associated IC manufacturing flow.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by a single larger company, and may even coexist in a common facility and use common resources.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format or DFII file format.

The mask house 130 uses the IC design layout 122 to manufacture one or more masks to be used for fabricating the various layers of the IC device 160 according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 includes an optical proximity correction (OPC) 136, a mask rule checker (MRC) 138 and a lithography process checker (LPC) 140. OPC 136 uses lithography enhancement techniques to compensate for image errors, such as those that can arise from diffraction, interference, or other process effects. OPC 136 may add assist features, such as scattering bars, serif, and/or hammerheads to the IC design layout 122 according to optical models or rules such that, after a lithography process, a final pattern on a wafer is improved with enhanced resolution and precision. Optical proximity correction according to the illustrated embodiment will be described in greater detail below. The mask data preparation 132 can include further resolution enhancement techniques, such as off-axis illumination, sub-resolution assist features, phase-shifting masks, other suitable techniques, or combinations thereof.

MRC 138 checks the IC design layout that has undergone processes in OPC 136 with a set of mask creation rules which may contain certain geometric and connectivity restrictions to ensure sufficient margins, to account for variability in semiconductor manufacturing processes. MRC 138 modifies the IC design layout to compensate for limitations during mask fabrication 144. In some scenarios, MRC 138 may undo part of the modifications performed by OPC 136 in order to meet mask creation rules. Consequently, resultant IC masks may not produce desirable IC features on a wafer. Enhancements in OPC 136 and MRC 138 processes according to various aspects of the present disclosure will be described in greater details below.

LPC 140 simulates processing that will be implemented by the IC manufacturer 150 to fabricate the IC device 160. LPC 140 simulates this processing based on the IC design layout 122 to create a simulated manufactured device, such as the IC device 160. In one embodiment, LPC 140 determines what shape a hypothetical photomask having a feature thus modified by OPC 136 and MRC 138 would produce on a wafer if the photomask was exposed by a photolithography tool described by the LPC models (or rules) 142. A simulated shape is called a contour. The simulated manufactured device includes simulated contours of all or a portion of the IC design layout. The LPC models (or rules) 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

After a simulated manufactured device has been created by LPC 140, if the simulated device is not close enough in shape to satisfy design rules, certain steps in the mask data preparation 132, such as OPC 136 and MRC 138, may be repeated to refine the IC design layout 122 further.

It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150. Additionally, the processes applied to the IC design layout 122 during data preparation 132 may be executed in a variety of different orders.

After mask data preparation 132 and during mask fabrication 144, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

The IC manufacturer 150, such as a semiconductor foundry, uses the mask (or masks) fabricated by the mask house 130 to fabricate the IC device 160. The IC manufacturer 150 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Figure 2:
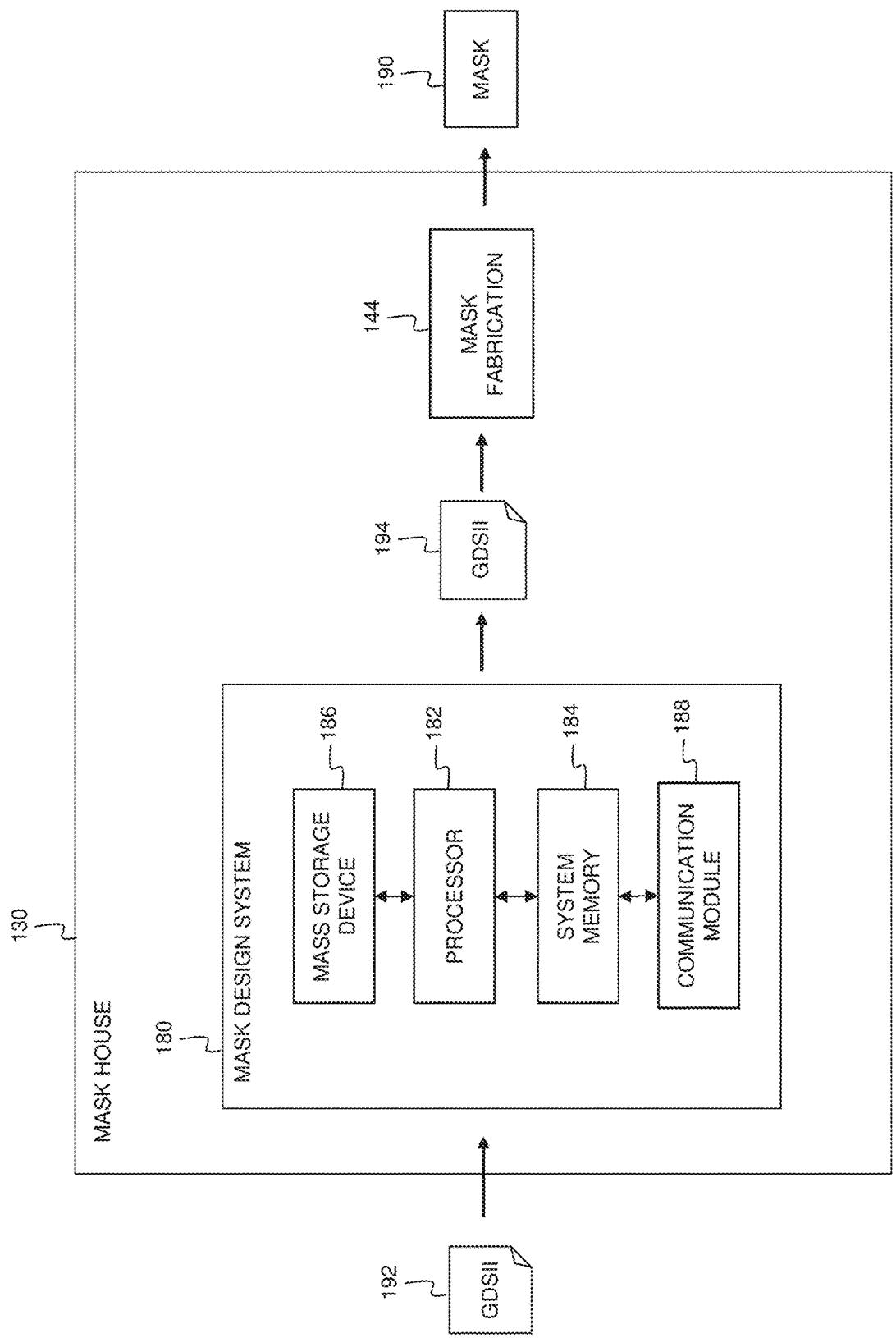
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices known in the art.

In operation, the mask design system 180 is configured to manipulate the IC design layout 122 according to a variety of design rules and limitations before it is transferred to a mask 190 by mask fabrication 144. For example, in one embodiment, OPC 136, MRC 138 and LPC 140 may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing a modified IC design layout to mask fabrication 144. In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

Figure 3:
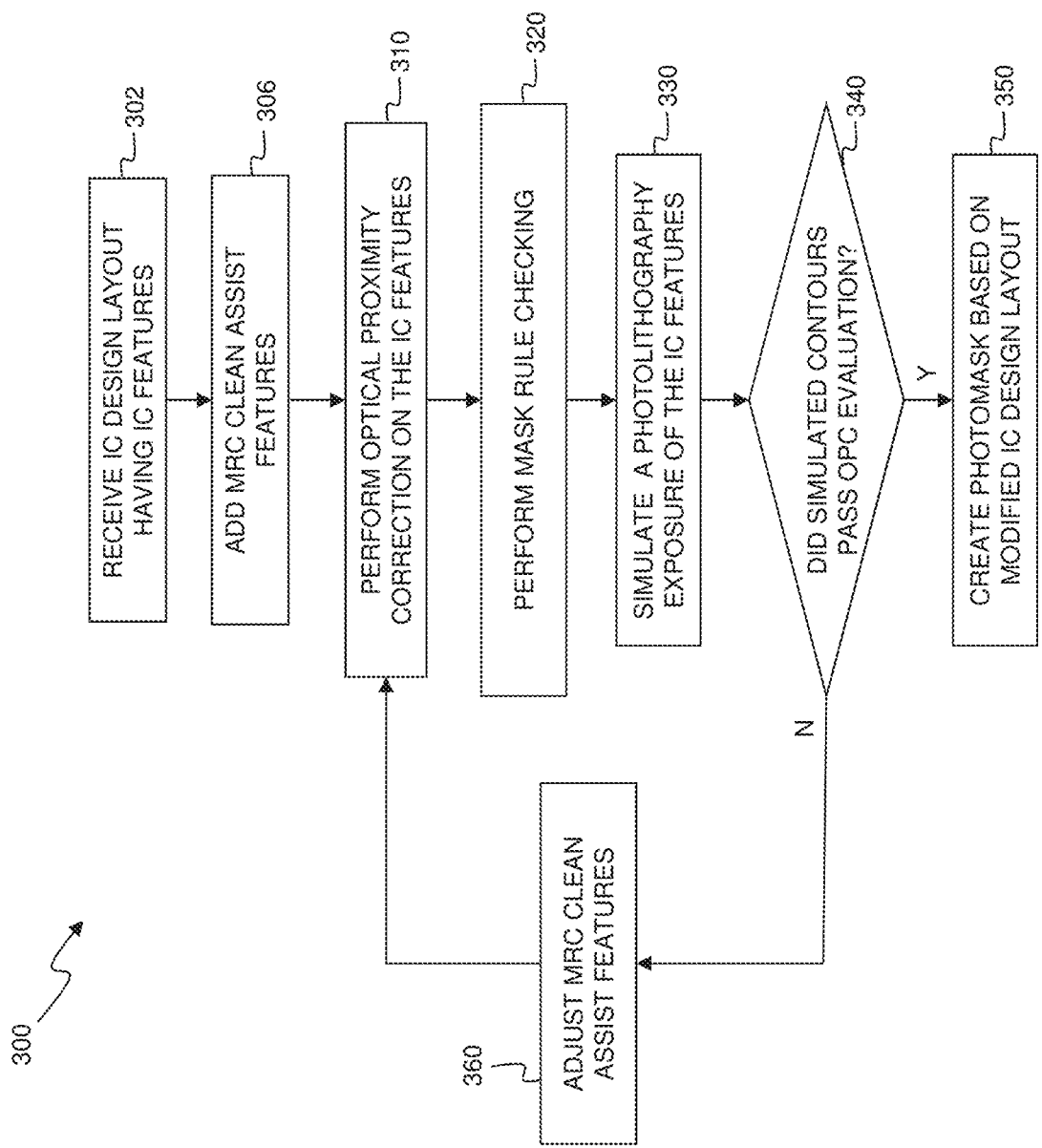
FIG. 3 is a high-level flowchart of a method of modifying an IC design layout before mask fabrication according to various aspects of the present disclosure.

FIG. 3 is a high-level flowchart of a method 300 of modifying an IC design layout before mask fabrication according to various aspects of the present disclosure. In one embodiment, the method 300 may be implemented in the mask data preparation 132 of mask house 130 shown in FIG. 1. Further, the method 300 in FIG. 3 is a high-level overview and details associated with each operation in the method will be described in association with the subsequent figures in the present disclosure.

The method 300 begins at operation 302 where the mask house 130 receives the IC design layout 122. The IC design layout 122 includes various geometrical patterns representing features of an integrated circuit. For example, the IC design layout 122 may include main IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout 122 may also include certain assist features, such as those features for imaging effect, processing enhancement, and/or mask identification information.

In this regard, FIG. 4A illustrates an example IC feature 400 that is a feature contained in the IC design layout 122. The IC feature 400 may also be viewed as a sub-feature 400a connected with a sub-feature 400b by a sub IC feature 400c. Ideally, when the IC feature 400 is formed on the integrated circuit 160, it will maintain the same shape, but this is not always so due to limitations in various manufacturing processes.

The method 300 (FIG. 3) proceeds to operation 306 where an assist feature 414, having a width W1 and a length W2, is added to the IC feature 400. Further reference is made to FIG. 4B. The assist feature 414 meets mask creation rules. It is thus referred to as an MRC clean assist feature. In the present embodiment, the assist feature 414 has an effect of blocking a part of the IC feature 400 from being formed on the mask 190. Moreover, the assist feature 414 itself will not be formed on the mask 190. Such assist feature is referred to as a negative assist feature. In the present embodiment, the assist feature 414 is thus referred to as an MRC clean negative assist feature. As a result of adding the assist feature 414, the IC feature 400 is divided into two features, 410a and 410b, as illustrated in FIG. 4B, for remaining operations in the method 300. From an alternative point of view, the effect of adding the assist feature 414 is to remove part of the IC feature 400c thus disconnecting the IC feature 400a from the IC feature 400b. In other embodiments of present disclosure, an MRC clean assist feature is added to a design layout such that multiple IC features are thus connected by the MRC clean assist feature to form one IC feature for remaining operations in the method 300. Such MRC clean assist feature is thus referred to as an MRC clean positive assist feature. An MRC clean positive assist feature itself is also formed on the mask 190 as a sub-resolution feature. In another word, it does not become part of an IC device on a wafer.

The method 300 next proceeds to operation 310 where an optical proximity correction, such as OPC 136, is performed on the IC design layout 122 as modified in operation 306. In general, OPC is utilized to modify the shape of an IC feature to compensate for diffraction or other process effects so that the shape of the feature as formed in the final integrated circuit closely matches the shape of the feature in the IC design layout.

Referring now to FIG. 4C, in the present embodiment, OPC 136 is performed on the features 410a and 410b to generate two modified features 420a and 420b respectively. In one embodiment, OPC 136 includes an iterative process where at least part of an IC feature boundary is modified and thereafter a simulation is performed to generate contours. Such process repeats until the simulated contours meet a target boundary. In the present embodiment as illustrated in FIG. 4C, parts of boundaries of the features 410a and 410b are modified such that contours 426 and 428 meet a target boundary as defined by an outer boundary of the IC feature 400, and the features 410a and 410b thus modified have become the features 420a and 420b respectively.

The method 300 next proceeds to operation 320 where the IC design layout as modified by operation 310 is checked against various mask creation rules. In the present embodiment, various dimensions of the features 420a and 420b are checked, including dimensions W4a, W5a, W4b and W5b, as shown in FIG. 4C. In the present embodiment, various spacing between the features 420a and 420b are also checked, including spacing W6 as shown in FIG. 4C. The various dimensions and spacing may be adjusted to meet mask creation rules. One rule on the spacing W6 is that it is a sub-resolution spacing during IC fabrication. In another word, when an IC is fabricated with a mask having the features 420a and 420b, the IC will contain one IC feature 430, as shown in FIG. 4D, and will not contain spacing W6.

The method 300 proceeds to operation 330 where a photolithography simulation, such as LPC 140 is performed on the design layout to generate simulated contours. In that regard, FIG. 4D illustrates example contours 436 and 438 that result from the photolithography simulation performed in operation 330 upon features 420a and 420b.

Next, the method 300 proceeds to operation 340 where simulated contours are compared to a target boundary along the IC feature 400. This operation is sometimes called an OPC evaluation. Specifically, it is determined whether the simulated contours meet or overlap the target boundary. If the simulated contours pass the OPC evaluation, then the method 300 finishes at operation 350 where the IC design layout having the features 420a and 420b is saved to the GDSII file 194 and transferred to mask fabrication 144, where the IC design layout is formed on the photomask 190. If the simulated contours do not pass the OPC evaluation, the method 300 proceeds instead to operation 360, where locations of the MRC clean assist features as well as various dimensions of MRC clean assist features are adjusted. Referring to FIG. 4B, in the present embodiment, dimensions W1 and W2 of the assist feature 414 may be adjusted while maintaining the assist feature 414 being MRC clean. Also in the present embodiment, the assist feature 414 may be moved within the sub-feature 400c while it still divides the IC feature 400 to two features. Thereafter, OPC steps described above are begun again to enhance the fidelity of the contours.

It is understood that the method of modifying an IC design layout before mask fabrication of the illustrated embodiment is simply an example and in alternative embodiments, additional and/or different steps may be included in the method. Further, the IC feature illustrated herein may be substituted for any number of different IC features, and the operations of method 300 may be applied to the different IC features in a similar manner. In one embodiment, after receiving an IC design layout in operation 302, an initial lithography process simulation of the IC design layout is performed to identify candidate IC features for operation 306. For example, a candidate IC feature is one having simulated contours off a target boundary as defined by an outer boundary of the IC feature.

Figure 5C:
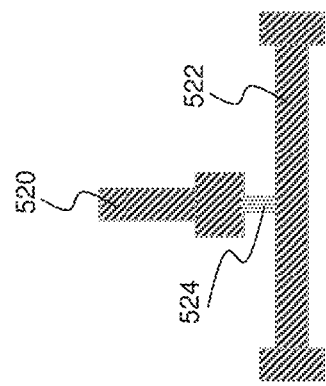
FIGS. 5A-5C illustrate another IC feature mask creation according to various aspects of the present disclosure.
Figure 5B:
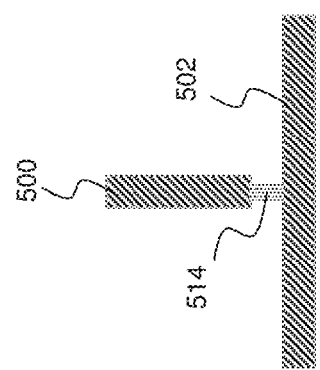
Figure 5A:
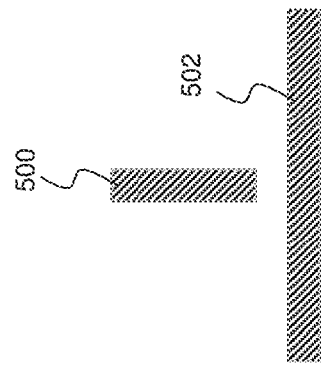
Figure 6C:
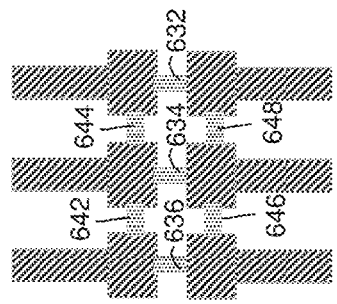
FIGS. 6A-6C illustrate various IC feature mask creation according to various aspects of the present disclosure.

Further, as illustrated above in FIGS. 4A-4D, the MRC clean negative assist feature 414 added in operation 306 has an effect of separating the IC feature 400 to multiple features with sub-resolution spacing for OPC 136 purposes. It thus increases the number of polygons in a design layout. In another embodiment, an MRC clean positive assist feature added in operation 306 may have an effect of connecting multiple IC features into one IC feature for OPC 136 purposes, thus reducing the number of polygons in a design layout. One example of using such an MRC clean positive assist feature is illustrated in FIGS. 5A-5C. FIG. 5A shows an IC design layout having two IC features, 500 and 502. The two IC features 500 and 502 are so spaced that an OPC is to be performed to the two IC features. FIG. 5B shows that an MRC clean positive assist feature 514 is added to the design layout, connecting the IC features 500 and 502. FIG. 6C shows that, OPC 136 modifies outer boundaries of IC features 500 and 502 for correcting optical proximity effect, resulting in modified IC features 520 and 522 respectively. Also shown in FIG. 5C is a sub-resolution feature 524, resulted from the MRC clean positive assist feature 514.

Figure 6B:
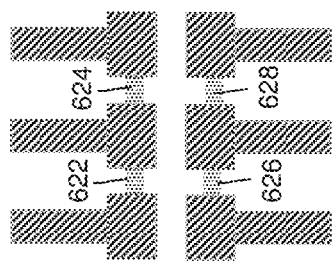
Figure 6A:
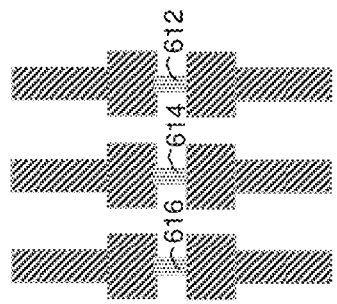

More examples of using MRC clean positive assist features for OPC purposes are illustrated in FIGS. 6A-6C. FIG. 6A shows MRC clean positive assist features, 612, 614 and 616, connecting main IC features head-to-head. FIG. 6B shows MRC clean positive assist features 622, 624, 626 and 628, connecting main IC features side-by-side. FIG. 6C shows MRC clean positive assist features, 632, 634, 636, 642, 644, 646 and 648, connecting main IC features head-to-head and side-by-side.

Further, the method 300 of modifying an IC design layout before mask fabrication of the illustrated embodiment is designed to be executed on any computing architecture, such as the mask design system 180 described in association with FIG. 2. For example, the method 300 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware subsystems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an integrated circuit (IC) design method. The method includes receiving a design layout of the IC, the design layout having a first main feature, and adding a negative assist feature to the design layout, wherein the negative assist feature has a first width, the negative assist feature divides the first main feature into a second main feature and a third main feature by the first width, and the first width is sub-resolution in a photolithography process.

In another exemplary aspect, the present disclosure is directed to an integrated circuit (IC) design method. The method includes receiving a design layout of the IC, the design layout having a first and a second main features, and adding an assist feature to the design layout, wherein the assist feature has a first length and a first width, the assist feature connects the first main feature and the second main feature by the first length and the first width is sub-resolution in a photolithography process.

In another exemplary aspect, the present disclosure is directed to an integrated circuit (IC) photo mask. The IC photo mask includes a first main feature of the IC, a second main feature of the IC and an assist feature connecting the first and the second main features, wherein the assist feature is a sub-resolution correction feature for correcting for optical proximity effect.

In another exemplary aspect, the present disclosure is directed to an integrated circuit (IC) photo mask. The IC photo mask includes a first feature and a second feature of the IC, wherein the first and the second features are spaced a distance from each other, the distance satisfies mask creation rules and the distance is sub-resolution for photolithography patterning.

What is claimed is:

1. An integrated circuit (IC) mask comprising:
two disconnected IC sub-features that correspond with an IC feature to be formed on a wafer by a lithography process using the IC mask, wherein a first one of the two disconnected IC sub-features is spaced from a second one of the two disconnected IC sub-features by a width; and
the width is sub-resolution for the lithography process, such that the IC feature does not include the width when formed on the wafer by the lithography process using the IC mask.

2. The IC mask of claim 1, wherein the two disconnected IC sub-features and the width have a combined contour that is different than a contour of the IC feature.

3. The IC mask of claim 1, wherein:
the IC feature has a first segment, a second segment, and a third segment that connects the first segment to the second segment;
the first one of the two disconnected IC sub-features has a fourth segment that corresponds with the first segment and a first sub-segment connected to the fourth segment that corresponds with the third segment; and
the second one of the two disconnected IC sub-features has a fifth segment that corresponds with the second segment and a second sub-segment connected to the fifth segment that corresponds with the third segment, wherein the second sub-segment is spaced from the first sub-segment by the width.

4. The IC mask of claim 3, wherein:
the first segment has a first contour;
the second segment has a second contour; and
the fourth segment has a third contour different than the first contour and the fifth segment has a fourth contour different than the second contour.

5. The IC mask of claim 3, wherein:
the fourth segment and the fifth segment each have a center portion disposed between a first end portion and a second end portion; and
the center portion has a first width, the first end portion and the second end portion have a second width, and the first width is different than the second width.

6. The IC mask of claim 5, wherein the first width is less than the second width.

7. The IC mask of claim 5, wherein the first segment and the second segment each have a third width, the first width is less than the third width, and the second width is about the same as the third width.

8. The IC mask of claim 3, wherein:
the width is a first width;
the fourth segment has a second width;
the first sub-segment has a third width that is less than the second width; and
the second sub-segment has a fourth width that is less than the second width.

9. The IC mask of claim 8, wherein the third width is the same as the fourth width.

10. The IC mask of claim 1, wherein the lithography process is an extreme ultraviolet (EUV) lithography process and the IC mask is an EUV mask.

11. An integrated circuit (IC) mask comprising:
a first sub-feature separated from a second sub-feature by a spacing, wherein the first sub-feature, the spacing, and the second sub-feature correspond with an IC feature of a plurality of IC features to be formed on a wafer by a lithography process using the IC mask; and
wherein the spacing has a sub-resolution dimension, such that a printed IC feature that corresponds with the IC feature does not include the spacing when formed on the wafer by the lithography process using the IC mask.

12. The IC mask of claim 11, wherein a combined contour of the first sub-feature, the second sub-feature, and the spacing is different than a contour of the IC feature.

13. The IC mask of claim 11, wherein the IC feature is an H-shaped feature, the spacing corresponds with a removed portion of a horizontal line of the H-shaped feature, the first sub-feature corresponds with a left vertical line and a remaining left horizontal portion of the H-shaped feature, and the second sub-feature corresponds with a right vertical line and a remaining right horizontal portion of the H-shaped feature.

14. The IC mask of claim 13, wherein:
the first sub-feature has a first portion that corresponds with the left vertical line and a second portion that extends from the first portion and corresponds with the remaining left horizontal portion; and
the second sub-feature has a third portion that corresponds with the right vertical line and a fourth portion that extends from the third portion and corresponds with the remaining right horizontal portion, wherein the spacing is between the second portion of the first sub-feature and the fourth portion of the second sub-feature.

15. The IC mask of claim 14, wherein the second portion of the first sub-feature and the fourth portion of the second sub-feature each have a first width that is less than a second width of the horizontal line of the H-shaped feature.

16. The IC mask of claim 14, wherein:
the first portion of the first sub-feature has a first width that varies along a first length of the first portion of the first sub-feature; and
the third portion of the second sub-feature has a second width that varies along a second length of the third portion of the second sub-feature.

17. The IC mask of claim 16, wherein a first variation of the first width is the same as a second variation of the second width.

18. The IC mask of claim 11, wherein the first sub-feature and the second sub-feature are a portion of a patterned layer of the IC mask, wherein the patterned layer includes opaque regions and transparent regions.

19. An integrated circuit (IC) mask comprising:
a first polygon sub-feature separated from a second polygon sub-feature by a sub-resolution distance, wherein:
the first polygon sub-feature, the second polygon sub-feature, and the sub-resolution distance correspond with a polygon of an IC design layout, wherein the sub-resolution distance corresponds with a removed portion of the polygon; and
a shape of an IC feature formed on a wafer using the IC mask having the first polygon sub-feature separated from the second polygon sub-feature by the sub-resolution distances is substantially the same as a shape of the polygon of the IC design layout.

20. The IC mask of claim 19, wherein the polygon has an H-shaped profile.

* * * * *